United States Patent [19]

Garner et al.

[11] Patent Number: 5,745,501
[45] Date of Patent: Apr. 28, 1998

[54] APPARATUS AND METHOD FOR GENERATING INTEGRATED CIRCUIT TEST PATTERNS

[75] Inventors: Robert E. Garner, Miyagi-ken, Japan; Connie Astrachan; Edward J. Hathaway, both of Austin, Tex.

[73] Assignee: Motorola, Inc., Schaumburg, Ill.

[21] Appl. No.: 824,381

[22] Filed: Mar. 26, 1997

Related U.S. Application Data

[63] Continuation of Ser. No. 546,249, Oct. 20, 1995, abandoned.

[51] Int. Cl.$^6$ ........................................... G06F 11/00
[52] U.S. Cl. .......................... 371/27; 371/27.1; 371/27.4
[58] Field of Search ........................... 371/27.1, 25.1, 371/22.5, 27.5, 27.4, 22.3; 395/421.07; 364/488, 578; 324/765

[56] References Cited

U.S. PATENT DOCUMENTS

| | | | |
|---|---|---|---|
| 4,736,375 | 4/1988 | Tannhauser et al. | 371/27 |
| 5,377,203 | 12/1994 | Khan | 371/27 |
| 5,379,308 | 1/1995 | Nhuyen et al. | 371/22.6 |
| 5,412,664 | 5/1995 | Bank | 371/22.6 |
| 5,446,742 | 8/1995 | Vahabi et al. | 371/27 |
| 5,475,624 | 12/1995 | West | 364/578 |
| 5,477,545 | 12/1995 | Huang | 371/22.3 |

Primary Examiner—Robert W. Beausoliel, Jr.
Assistant Examiner—Nadeem Iqbal
Attorney, Agent, or Firm—Keith E. Witek

[57] ABSTRACT

A method and apparatus for generating integrated circuit test patterns (218) to test a functionality of integrated circuits. Module test stimuli (202) for each module present in an integrated circuit (10) are generated and retained (102). The module test stimuli (202) are translated to module drive patterns (206). Module expected patterns (210) are determined based on the module drive patterns (206) or module test stimuli (202) using module models (208). Integrated circuit data (216) describing the structure and timing of the integrated circuit (10) is used to translate the module patterns (212) into integrated circuit test patterns (218). The integrated circuit test patterns (212) are validated (220), transformed to test vectors (226), and the test vectors (226) are applied to the external connections of the integrated circuit (10) to test a functionality of the integrated circuit (10). A data processing system (300) creates the integrated circuit test patterns (218). The steps of the present invention are incorporated into a computer readable medium and a method for manufacturing and testing an integrated circuit (10).

13 Claims, 8 Drawing Sheets

APPARATUS AND METHOD FOR GENERATING INTEGRATED CIRCUIT TEST PATTERNS

This application is a continuation of prior patent application Ser. No. 08/546,249 filed Oct. 20, 1995, now abandoned.

TECHNICAL FIELD OF THE INVENTION

This invention relates generally to integrated circuits and more particularly to generating test patterns for the testing of modular integrated circuits to verify their functionality.

BACKGROUND OF THE INVENTION

Modern integrated circuits have become both large and complex. While the increase in size and complexity of modern integrated circuitry has provided significant increases in performance, great strains have been placed on those who design and test the integrated circuits.

The design of modern integrated circuits, microprocessors for example, requires substantial effort. However, since a single microprocessor design may be used with little variation to manufacture millions of parts, the design effort is recovered through the sale of parts. However, in the area of custom integrated circuitry, where purchasers require complex integrated circuitry in low volumes, significant design effort expended is not necessarily recoverable through the sale of the products.

One technique that has been used to decrease the required design efforts relating to custom integrated circuitry is to design standard functional modules and to use the modules as components within the custom circuitry. Using this technique, substantially custom designs are expeditiously completed. Further, once a base design is completed, variations are easily made adding or deleting modules within the integrated circuitry. Thus, based upon a customer's specifications, a custom integrated circuit may be designed that meets or exceeds the specifications with a significantly reduced design effort.

FIG. 1 illustrates one particular embodiment of an integrated circuit 10 having a modular design. The integrated circuit 10 includes various functional components that contribute to the overall functionality of the integrated circuit. As illustrated in FIG. 1, the integrated circuit 10 includes a CPU 14, read-only memory (ROM) 16, random access memory (RAM) 18, an electrically erasable programmable read-only memory (EEPROM) 20, and a module select unit 24. Further, the integrated circuit 10 includes a low voltage inhibit detector 22, a communication port 26, a counter 28, a first timer 30, a second timer 32, and a main input-output (I/O) unit 34. The integrated circuit 10 also includes also a reset unit 36, a clocking unit 38, and a test port 40. The various modules of the integrated circuit communicate via an internal bus 12 that includes an address bus, a data bus, and control bus components.

As one skilled in the art will readily appreciate, the components contained within the circuit 10 are standard with known general functions. Various modules, not needed in a particular application, could be deleted from the circuit 10 to decrease the cost of the integrated circuit 10 for the application. Where additional functionality is required, components could be added to the integrated circuit 10 or the size of the existing components could be increased. In some applications, to reduce cost, all functional modules would remain within the circuit 10 but the external connections of the integrated circuit 10 would be decreased. For example, the main input-output block 34 may only have 8 of its I/O connections 44 connected externally if not all lines are needed for a particular application. With these variations, an overall functionality increase or decrease may be attained without a substantial redesign of the circuit 10.

Commonly, the functionality of an integrated circuit 10 is verified by placing the integrated circuit in a tester, applying integrated circuit test patterns to the integrated circuit using the tester, obtaining output from the integrated circuit 10 using the tester, and checking the output against expected patterns contained in the integrated circuit test patterns. The generation of integrated circuit test patterns is expensive since they are typically created manually or with minimal assistance from a computer software program. When used in conjunction with a high volume part, the integrated circuit test patterns are used to test millions of identical integrated circuits. Thus, the effort involved in created the integrated circuit test patterns is justified for high volume parts. However, the cost of producing a single integrated circuit test pattern for a low volume part, such as a custom integrated circuit, is typically too large to recover for a low volume production run.

Quick turn around time is often required in the design of custom integrated circuits. Thus, the modular integrated circuit design technique previously discussed significantly reduces the turnaround time required to deliver parts. However, when new integrated circuit test patterns must be generated for each variation of a custom integrated circuit, the creation of the integrated circuit test patterns adds to the overall delivery time of the integrated circuits.

Thus, there exists a need in the art for a technique to quickly and accurately generate integrated circuit test patterns for the testing of custom integrated circuits in general and for the testing of modular integrated circuits in particular.

DETAILED DESCRIPTION OF THE DRAWINGS

The present invention relates to a method and apparatus for generating integrated circuit test patterns, the integrated circuit test patterns used in conjunction with a tester for testing the functionality of integrated circuits. In accordance with the present invention, a modular approach is taken in creating test patterns for the overall integrated circuit based upon the modules contained within the integrated circuit and the external connections available. It is first determined which modules are present within the integrated circuit and module test stimuli for the modules are retrieved. Next, integrated circuit information is retrieved which describes the overall structure and timing requirements of the integrated circuit. Based upon the integrated circuit information, the method then translates the module test stimuli to integrated circuit drive patterns that are applied externally to the integrated circuit to fully exercise each of the modules within the integrated circuit. The method also generates integrated circuit expected patterns that are used to compare the actual output produced by the integrated circuit during testing of the integrated circuit. If the expected results compare favorably to the actual results, the integrated circuit is functional. Thus, the present invention provides an automated method and apparatus for generating integrated circuit test patterns that may be used to test the functionality of an integrated circuit.

Figure 2:
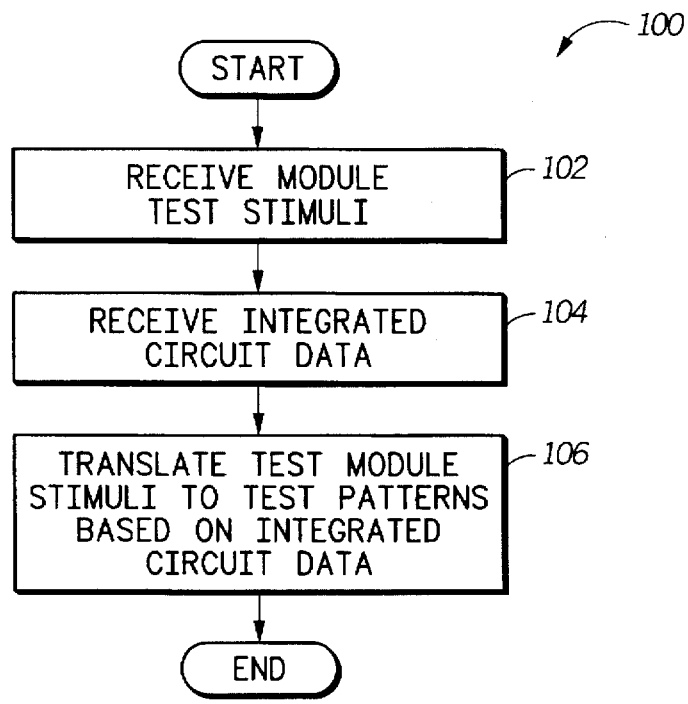
FIG. 2 is a logic diagram illustrating a method for generating integrated circuit test patterns in accordance with the present invention.

FIG. 2 illustrates a method 100 for generating an integrated circuit test pattern. The method includes as a first step 102 receiving a plurality of module test stimuli. Each of the module test stimuli is used to test the functionality of a respective module of a plurality of modules of the integrated circuit. Preferably, the module test stimuli are written in a high level language that a designer or test engineer may use to guarantee that each function of a particular module is exercised. However, the module test stimuli could also be written in a lower level language such as assembly language. The module test stimuli, when converted to a binary format could be applied to the connections of respective module of the plurality of modules to fully exercise the functions of the particular module.

As one skilled in the art will readily appreciate, during the exercising of a module, the module produces output which represents the result of a particular operation of the module. Therefore, contained within the module test stimuli are instructions which determine an expected output produced by the module during an actual operation of the module. These expected results are eventually used during the actual testing of the module, with the actual output produced by the module being cross referenced against the expected results.

Most modules must be fully accessed via the internal bus 12 of the integrated circuit 10. However, some of the functional modules may also have connections that are accessed external as integrated circuit connections. Thus, the module test stimuli include instructions that exercise the integrated circuit connections both internal to the integrated circuit 10 and external to the integrated circuit. For example, with reference to FIG. 1, the Main I/O module 34 includes both internal connections to the internal bus 12 and external connections 44. Thus, to fully exercise the Main I/O module 34, signals will be transmitted to and received from the Main I/O module 34 via both the internal bus 12 and the external connections 44. The manner in which such access is performed depends upon how the integrated circuit external connections are made and how the internal bus 12 is accessed via the integrated circuit external connections.

Referring again to FIG. 2, the method 100 next includes at block 104, the step of receiving integrated circuit data. The integrated circuit data indicates which modules are present in the integrated circuit and defines the relationship between the external connections of the integrated circuits and the module connections. The integrated circuit information also includes all timing specifications relating to the integrated circuit.

Taken as a whole, the integrated circuit data includes a complete description of a particular integrated circuit. For example, integrated circuit data for the integrated circuit of FIG. 1 would describe the structure of the integrated circuit 10 and the timing requirements of the integrated circuit. The integrated circuit data would indicate how each module within the integrated circuit 10 may be fully accessed via external connections as well as the timing specifications relating to the connections. For example, the integrated circuit data associated with FIG. 1 would relate that the ROM 16 is present and is accessible through the test port 40 via the internal bus 12. The integrated circuit data relates how the internal bus 12 may be accessed via the test port and the maximum frequency of operation of the internal bus 12.

Figure 1:
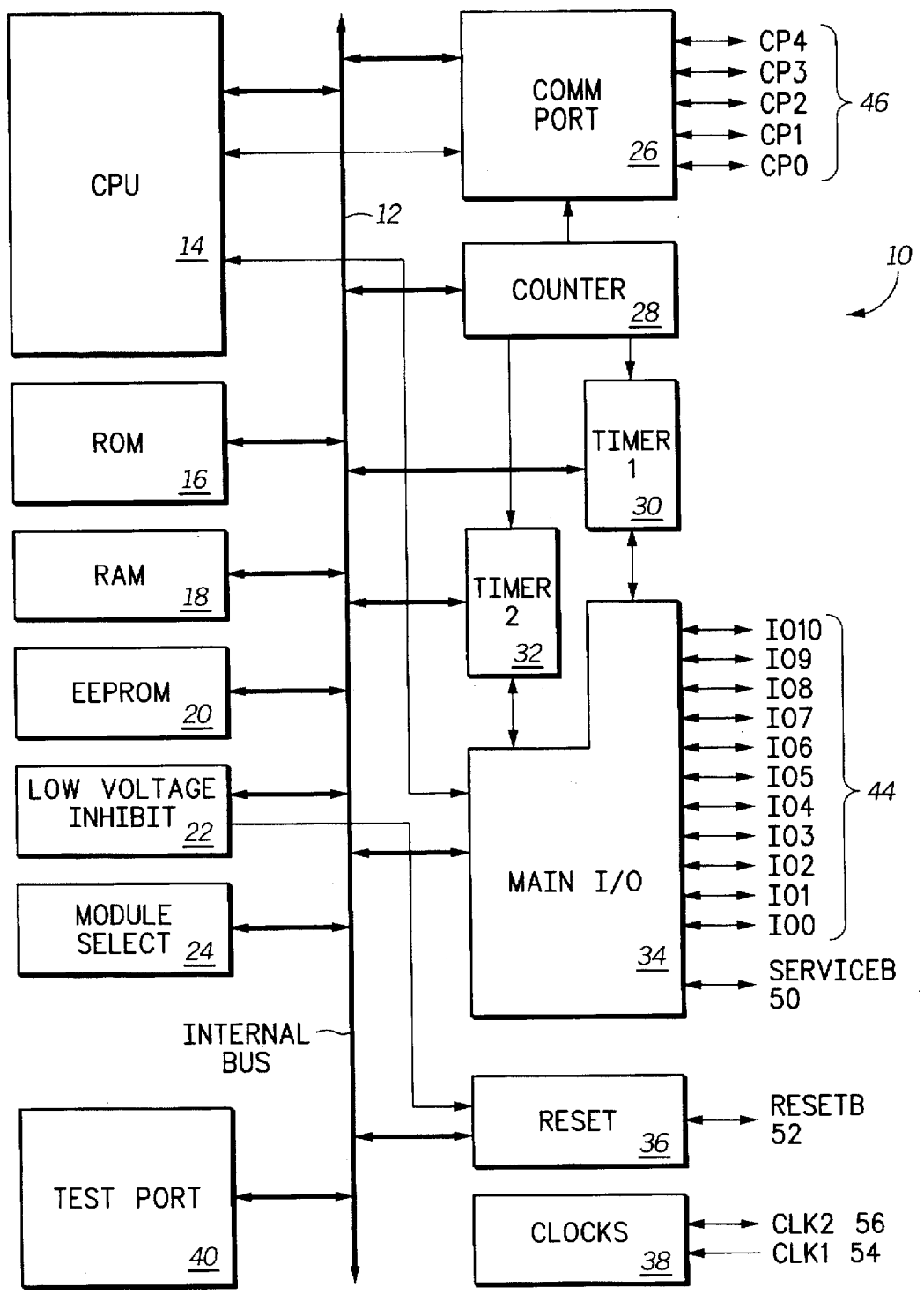
FIG. 1 is a block diagram illustrating a prior art modular integrated circuit.

As one skilled in the art will readily appreciate, alterations in the integrated circuit of FIG. 1 would result in altered integrated circuit data. For example, if a first integrated circuit included Main I/O 34 having 16 input/output lines while a second integrated circuit included the same I/O but with only four input/output lines connected externally, the designs would have differing integrated circuit data. However, the integrated circuit data for each design would fully describe the structure and timing requirements of the respective design.

In a preferred embodiment of the present invention, the test port 40 is used that allows for a streamlined testing of the integrated circuit 10. By using the test port 40, internal bus 12 cycles may be generated to test the functionality of the modules of the integrated circuit in accordance with the module test stimuli. Through the use of the test port 40, all modules may be disabled except for the module under test so that the module under test may be tested in as few internal bus cycles as possible. Without the use of the test port 40, the CPU 14 in the integrated circuit 10 would have to generate the internal bus cycles, the CPU 14 itself being one of the modules within the integrated circuit, not guaranteed to function perfectly when tested and requiring its own internal cycles when generating the bus cycles. By using the test port 40, total testing time required to test the integrated circuit is reduced by reducing the number of bus cycles required to fully test the functionality of the integrated circuit 10.

The integrated circuit data also preferably includes the relationship between the timing requirements of the test port 40 and the timing requirements of the integrated circuit 10 itself. Preferably, the integrated circuit data relates a minimum period of a system clock of the integrated circuit, or a minimum period of half of the system clock, as well as a slot width, or period of operation, of the test port. In this fashion, the integrated circuit data includes information required to create the internal bus 12 cycles required to exercise the modules within the integrated circuit via the external connections of the integrated circuit 10.

As one skilled in the art will readily appreciate, the functionality of the test port 40 may be altered depending upon the complexity of the integrated circuit 10. If one particular embodiment of a modular integrated circuit includes many functional modules, a respective desired test port must have great functionality. However, in another situation, wherein a modular integrated circuit contains only a few functional modules, a test port having lesser functionality may be selected. In this fashion, costs associated with the particular integrated circuits will be minimized while still retaining the ability to completely test the functionality of the particular integrated circuit.

Referring again to FIG. 2, the method 100 next includes at step 106 translating the plurality of module test stimuli to a plurality of integrated circuit test patterns based upon the integrated circuit data. Once generated, the plurality of integrated circuit test patterns include both integrated circuit drive patterns and integrated circuit expected patterns. The integrated circuit drive patterns represent the data that is applied to the external connections of the integrated circuit to test the functionality of the plurality of modules in the integrated circuit. The integrated circuit expected patterns represent the data that a correctly functioning integrated circuit will produce.

The integrated circuit test patterns generated in step 106 will preferably be provided directly to a test engineer who will convert the integrated circuit test patterns to test vectors that work with a particular tester used at the facility. Typically, this step is automated as well. In accordance with the present invention, the integrated circuit patterns also include information that may be used to create the strobes that the test engineer provides to the tester. The strobes determine the testing points or strobe points at which data is collected from the integrated circuit under test. After collection, the data from the integrated circuit under test is then compared to the integrated circuit expected patterns to determine whether the integrated circuit is functioning properly.

The method 100 of the present invention may be used with any integrated circuit constructed, as long as the integrated circuit includes modules that may be exercised separately via its connections. Once the module test stimuli have been created for a particular module, the stimuli may be reused over and over in accordance with the steps of the present invention to generate integrated circuit test patterns for any integrated circuit that includes the module. In this fashion, the method of the present invention provides for great automation and, resultantly, a decrease in cost with an increase in accuracy of result. Thus, the important benefit of reducing turnaround time with custom integrated circuits using the modular concept is realized.

However, the benefits provided by the present invention relate not only to modularly designed integrated circuits but other integrated circuits as well. Each particular integrated circuit design may be segregated into functional blocks. Module test stimuli may be written for each functional block. Based upon the module test stimuli and integrated circuit data of the integrated circuit, integrated circuit test patterns may be generated.

Figure 3:
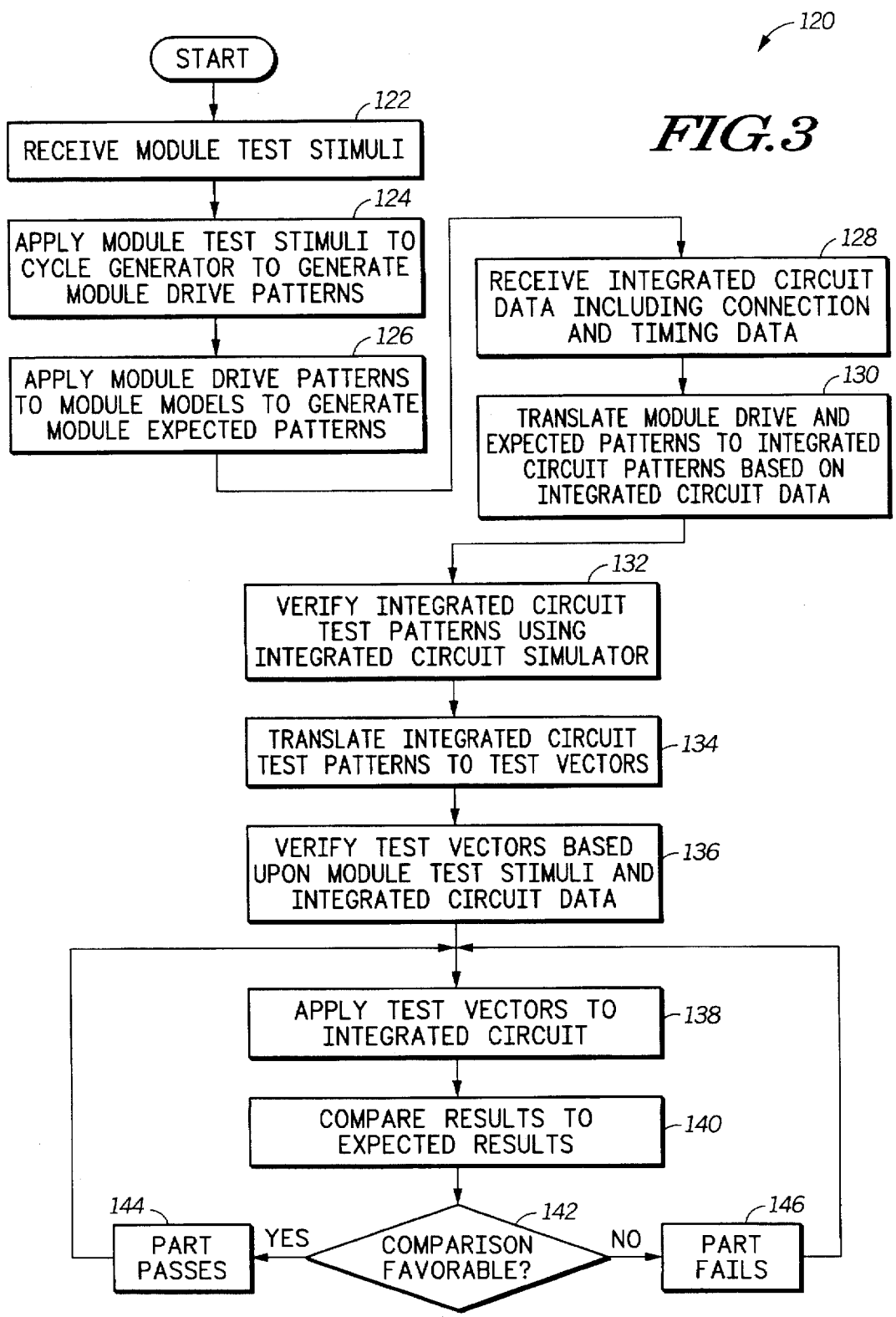
FIG. 3 is a logic diagram illustrating an alternative method for generating integrated circuit test patterns and for testing integrated circuitry in accordance with the present invention.

FIG. 3 illustrates a more detailed embodiment of a method 120 for generating integrated circuit test patterns. Method 120 includes at a first step 122 receiving module test stimuli. The module test stimuli relate to particular functional modules within an integrated circuit. As has been previously discussed, module testing stimuli preferably are written in a high level language such that the complete functionality of the module may be more easily tested.

Next, at step 124, the method 120 includes applying module test stimuli to a cycle generator to generate module drive patterns. Preferably, the cycle generator is a software converter that receives the high level language module test stimuli and converts the high level language module test stimuli to the module drive patterns which comprise binary data. As one skilled in the art will readily appreciate, the high level language module test stimuli will be of a functional nature while the module drive patterns will relate the particular data that must be asserted to the inputs of the modules to test the particular functionality required.

While most data will be asserted to the functional modules via the internal bus of the integrated circuit, some of the functional modules include external connections. In this situation, the module drive patterns will include both data that is provided to the modules via the internal bus as well as data that is provided to the modules via the external connections. By applying the module drive patterns to the modules of the integrated circuits, the functionality of the modules is tested.

Subsequently, at step 126, the method 120 includes applying the module drive patterns to module models to generate the module expected patterns. In accordance with principles known in the art, mathematical models may be generated for each functional module contained within the integrated circuit. Upon the application of the module drive patterns to the module models, the module models will generate the module expected patterns. These expected patterns, of course, represent the expected output that would be present at the module connections when the modules are driven by the module drive patterns and the modules function perfectly.

Step 128 of the method 120 comprises receiving integrated circuit data for the integrated circuit. As was previously described, the integrated circuit data relates the structure and timing requirements of the integrated circuit.

At step 130, the method includes translating the module drive and module expected patterns to integrated circuit patterns based on the integrated circuit data. As has been previously discussed, the internal bus of the integrated circuit is typically accessed through a test port. The test port typically includes registers, other latches, and data paths that must be controlled in order to provide desired data to the internal bus and to receive internal data from the internal bus. Thus, step 130 must be performed such that the modules are exercised via the connections that are available externally in accordance with the structure and timing requirements of the test port. Further, step 130 must be performed based upon the direct external connections to the individual modules. By considering the connectivity of the external connections of the integrated circuit to the internal bus as well as the connectivity of the external connections to the individual modules and the timing constraints associated with each, the step 130 generates the integrated circuit patterns that fully exercise the modules within the integrated circuit as well as the connections within the integrated circuit via the external connections.

At step 132, the method 120 next includes verifying the integrated circuit test patterns using an integrated circuit simulator. Preferably, the integrated circuit simulator is a software tool that is created based upon the design of the integrated circuit. The integrated circuit simulator includes models for each of the modules within the integrated circuit as well as models for the internal and external connections of the integrated circuit. When the integrated circuit patterns are applied to the integrated circuit simulator, resultant outputs are produced that represent the outputs of the integrated circuit at the external connections. The resultant outputs from the circuit simulator are then compared to the expected patterns contained within the integrated circuit patterns. This comparison, if favorable, helps to verify the correctness of the integrated circuit patterns that have been generated.

Next, at step 134, the method 120 includes translating the integrated circuit test patterns to test vectors. As has been previously discussed, the conversion is typically performed by a software program under the supervision of a test engineer. Depending upon the particular requirements of the hardware tester used to test the functionality of the integrated circuit, test vectors are produced and provided to the hardware tester. The hardware tester may then use the test vectors in the testing of the integrated circuit. Step 134 includes the substep of setting strobes used by the tester to receive output from the external connections of the integrated circuit during testing. In the prior art, strobes were set manually by the test engineers after extensive review of the integrated circuit test patterns that were also manually generated. However, the method of the present invention provides the important benefit of automatically setting the strobes of the tester to collect the required data.

At step 136, the method subsequently includes verifying the test vectors based upon the module test stimuli and the integrated circuit data. Step 136 offers a second level of verification of the test vectors used to test the actual integrated circuits. Step 136 preferably is performed using a software program developed for the purpose. The software program also includes functional models of the modules in the integrated circuit and produces results based upon the integrated circuit drive patterns contained in the integrated circuit test patterns. The results produced from the application of the test vectors are then compared to the integrated circuit expected patterns as a verification that the integrated circuit drive patterns have been correctly translated to test vectors and applied to the integrated circuit.

Next, at step 138, the method includes applying the test vectors to the actual integrated circuits to test the functionality of the integrated circuits. Preferably, a integrated circuit under test is either manually or automatically inserted into a test socket of the tester that makes electrical connections with the external connections of the integrated circuit. Test vector signals are then applied to the external connections of the integrated circuit through the socket. As one skilled in the art will readily appreciate, the test vector signals are electrical signals having desired values, application times, and durations. Test vector signals include all power and ground signals, control signals, interrupt signals, clocking signals, input/output signals, and all other signals that are required to fully test the operation of the integrated circuit.

The test vector signals are applied in such a manner as to produce output at the external connections of the integrated circuit at specific points in time. At these points in time, the outputs are latched based upon a strobe signal and stored in the tester. As was previously discussed, the strobe signals that are used to determine the points in time when output data is latched are automatically determined based upon the integrated circuit test patterns.

After the test vectors have been applied to the integrated circuit in step 138, the method proceeds to step 140 wherein the results obtained from the application of the test vectors to the integrated circuit are compared to the expected results contained within the integrated circuit test patterns. This crucial step determines whether or not the integrated circuit is functioning properly. Preferably, this step includes simply comparing the binary results obtained from the integrated circuit with the binary integrated circuit test patterns using a software program. However, the results could be compared in any manner known in the art.

Next, the method 120 proceeds to decision step 142 wherein it is determined whether or not the comparison is favorable. If the comparison is favorable, the method proceeds to step 144 wherein it is determined that the integrated circuit passes the test. However, if the comparison at step 142 is unfavorable, the method proceeds to step 146 and the part is determined to have failed. A failed part is not sellable to a customer and is typically scrapped unless it can be repaired.

The failure of a part represents a loss of both time and money in the manufacture of the part. However, if the part is not properly tested at steps 138 and 140, a more harmful event may occur—a defective part will pass testing and be shipped. The costs associated with shipping defective parts are typically much greater than the costs associated with determining that a part has failed and scrapping the part. Thus, the accurate testing and failing of integrated circuits is highly important.

However, the accurate testing of an integrated circuit depends upon the accuracy of the integrated circuit test patterns that are generated to test the circuits. Thus, the method of the present invention, with its greatly reduced potential for error provides superior validation results as compared to the prior art methods of generating integrated circuit test patterns.

From both steps 144 and 146 the method proceeds to step 138 where another integrated circuit is tested. The method therefore preferably continues in the testing loop until all integrated circuits requiring testing have been tested. At that point in time, the method will terminate.

Thus, the method 120 illustrated in FIG. 3 provides the important benefits of reduction in time of generating integrated circuit test patterns, increased accuracy in generating the test patterns, automated conversion from the test patterns to test vectors, the automatic setting of strobes for collecting test data, and the automatic verification of the data collected. Thus, the method of the present invention, as well as the associated apparatus that will be described in more detail hereinafter, reduces cycle time in integrated circuit construction, reductes costs of the construction, increases accuracy in testing, reduces the failure of compliant parts, and increases the detection of defective parts.

Figure 4:
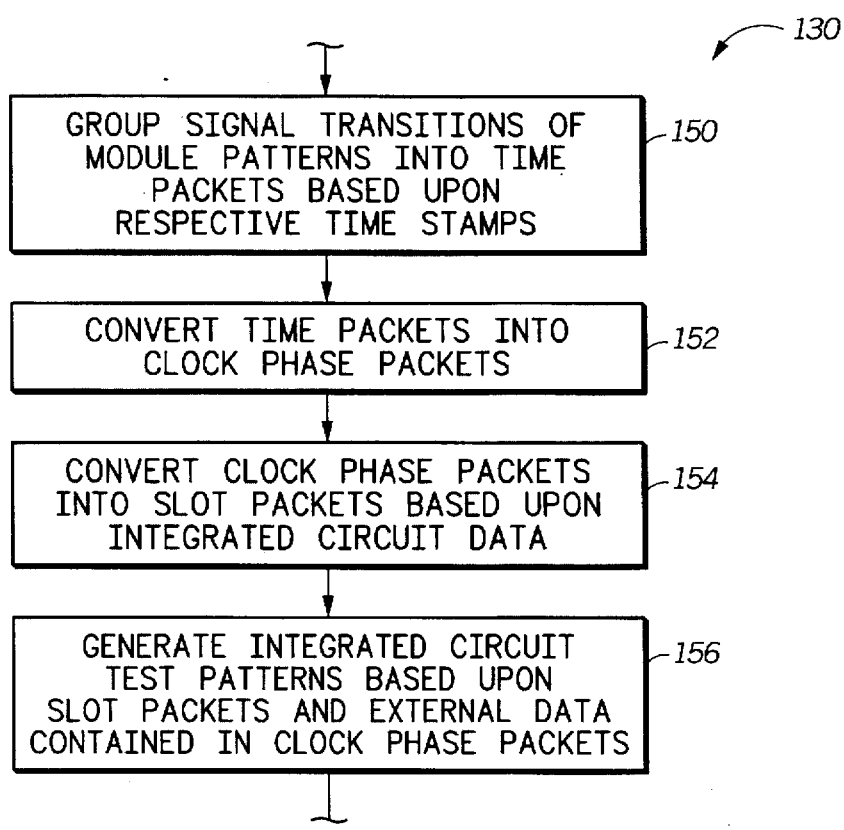
FIG. 4 is a logic diagram illustrating in more detail method step 130 of the method 120 illustrated in FIG. 3.

FIG. 4 illustrates a more detailed explanation of step 130 illustrated in FIG. 3. Preferably, step 130 includes a first substep 150 of grouping the signal transitions of the module test patterns into time packets based upon respective time stamps. When the module test stimuli are compiled or converted at step 124 of method 120, a number of bits are generated within the module test patterns. Preferably, these bits comprise data that is be grouped according to time stamps and, at particular points in time, the data is asserted into the module or read from the module. Thus, step 150 organizes the signal transitions of the module test patterns into time packets based upon the respective time stamps. Step 150 is primarily an organizational step in the process of creating integrated circuit test patterns from the plurality of module test patterns that have been previously created.

Next, at step 152, the method includes converting the time packets into clock phase packets. Each clock phase packet corresponds to one phase of a clock cycle of the internal bus of the integrated circuit. Each clock phase packet contains all time packets corresponding to the phase of the particular clock cycle. Thus, step 152 relates the particular time packets to the phases of the internal clock within the integrated circuit.

Next, at step 154, the method includes converting the clock phase packets into slot packets wherein each slot packet corresponds to one access of a test port contained within the integrated circuit. The slot packets are created based upon the desired internal bus cycles of the clock phase packets, the structure of the test port, and the timing requirements of the test port and the internal bus. The slot packets therefore represent information passed through the test port to drive data to the internal bus or receive data from the internal bus. Most, but not all, of the clock phase packets become slot packets. While most module test patterns are initiated via the test port, some of the test patterns are applied to modules via external connections that directly connect to a particular module. Thus, even though portions of the test patterns are not assigned to a slot packet, they retain their identity and timing information in the clock phase packets.

Next, at step 156, the method includes generating the integrated circuit test patterns based upon the slot packets and the externally applied data contained in the clock phase packets. As was previously discussed, the integrated circuit data includes timing and connectivity data relating to the test port used in conjunction with the integrated circuit. Thus, the slot packets are organized and ordered to correctly perform both read and write accesses of the test port and read and write accesses of the module through the module external connections of the integrated circuit. Thus, step 156 includes merging the slot packet information and the external data information obtained from clock phase packets to finally generate the integrated circuit test patterns. Such a merging of data will include shifting accesses via the test port and external connections in time such that the signals are applied to, or read from, a particular module at a correct point in time.

Upon the completion of step 156, the integrated circuit test patterns represent a complete set of information that must be applied to the external connections of the integrated circuit to fully test the functionality of each and every module contained within the integrated circuits and the information that is to be compared to the results obtained from the integrated circuit under test.

Figure 5:
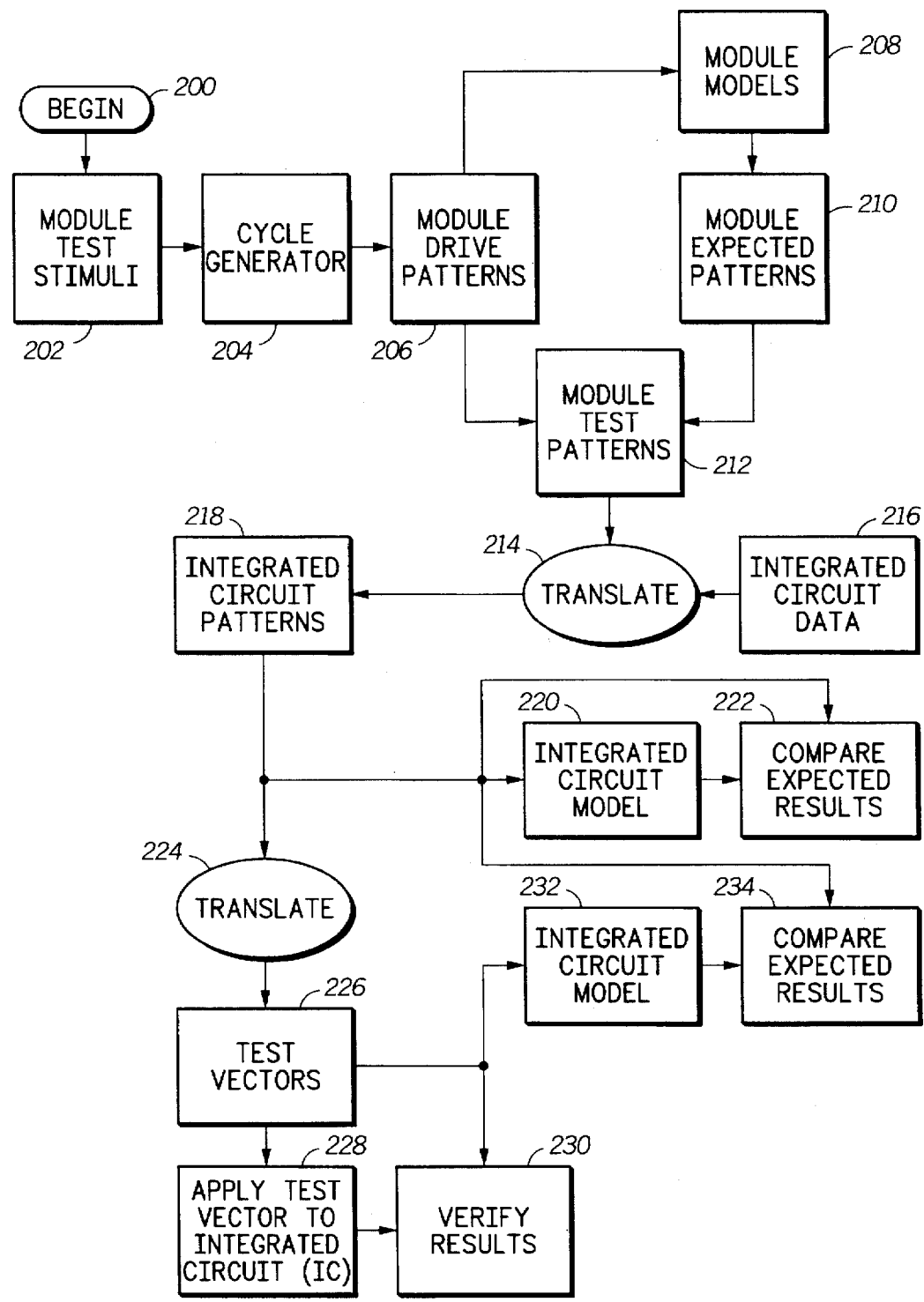
FIG. 5 is a logic diagram illustrating a flow of data and data manipulation steps in accordance with the method and apparatus of the present invention.

FIG. 5 illustrates the data flow and data manipulation process of the methods of the present invention. The method begins at block 200 and proceeds first to block 202 wherein the module test stimuli are assembled. Once the module test stimuli are assembled, the method proceeds to block 204 wherein the module test stimuli are applied to a cycle generator which generates the module drive patterns as represented as block 206. The module drive patterns are then applied to module models at block 208 and module expected patterns are produced, as represented at block 210. The module drive patterns and module expected patterns are then combined to produce the module test patterns at block 212.

Then, the module test patterns at block 212 and integrated circuit data at block 216 are translated at block 214 to produce the integrated circuit patterns at 218. Once the integrated circuit patterns 218 are generated, they are applied to the translator which produces test vectors 226 and the strobes necessary to collect data produced by the integrated circuit under test.

The integrated circuit test patterns are also applied to integrated circuit models to produce expected results. At block 222, the expected results contained within the integrated circuit patterns are compared to the results produced by of the integrated circuit models created at block 220 upon an application of the integrated circuit drive patterns. The cross check at block 222 provides a test of the validity of the integrated circuit patterns by cross reference. Another cross check is made wherein the test vectors at block 226 are applied to an integrated circuit model at block 232 and the results from the integrated circuit model based upon the test vectors are compared to the integrated circuit expected patterns at block 234. This comparison serves as a second cross check of the integrated circuit patterns as well as the test vectors.

If either the cross reference check at block 222 or 234 does not agree, then it serves as notice for the test engineers to determine wherein the problem has been created and to fix the problem before the test vectors are applied to the integrated circuit. If no problems have been found in the cross checks, the test vectors are applied to the integrated circuits at block 228. Then, at block 230, the results from the actual test of the integrated circuit are verified against the expected results of the test vectors.

As described, the method of the present invention includes numerous cross checks in order to verify the correctness of the integrated circuit test patterns prior to their use. In this fashion, while the modular and automated nature of the present invention generates test patterns in shortened periods of time, the cross checks also guarantee the accuracy of the test patterns that have been generated. In conjunction, these two benefits both reduce cycle time associated with the generation of the integrated circuit test patterns as well as the associated costs that are saved by the reduced time both in generation and testing.

Figure 6:
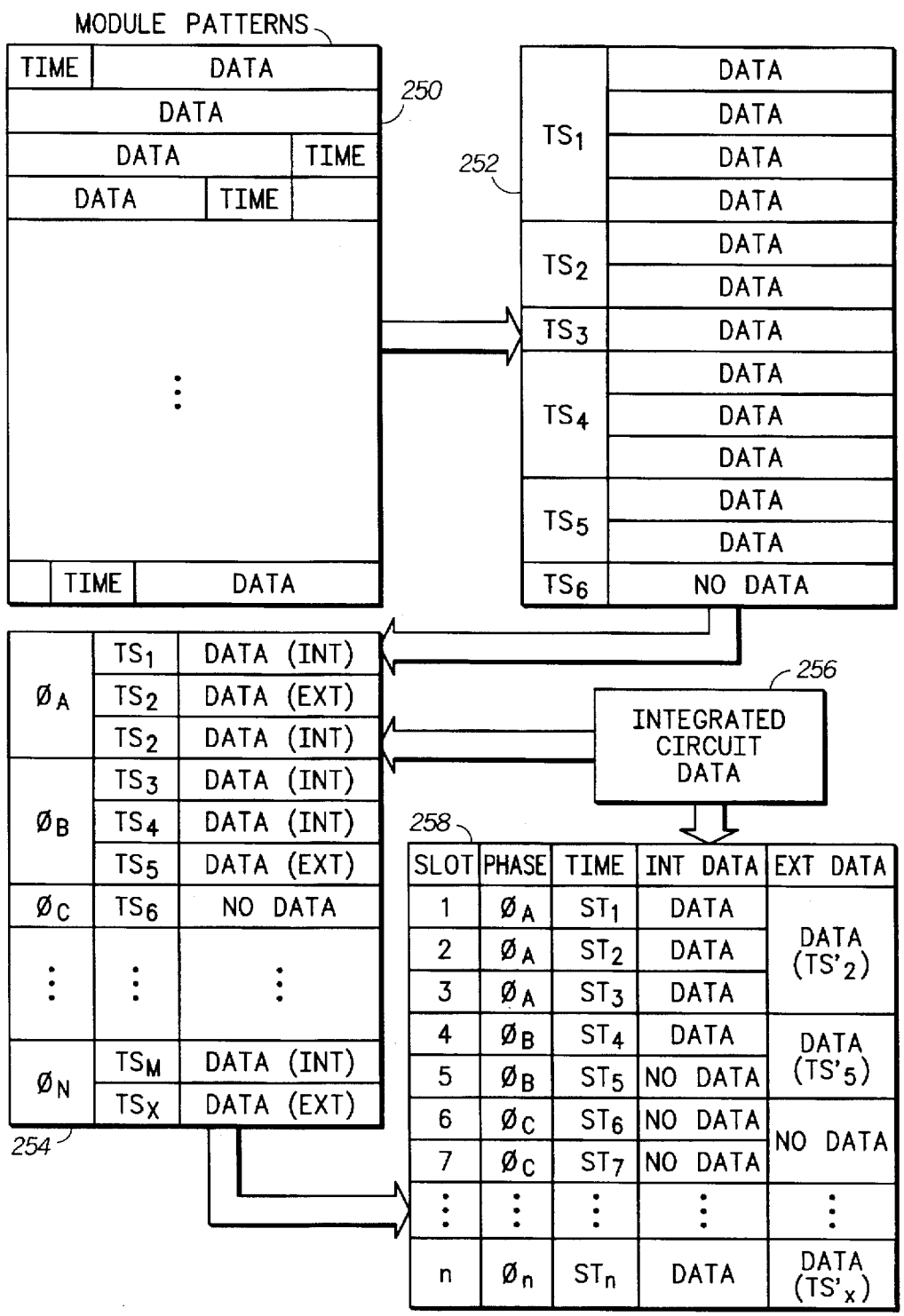
FIG. 6 is a logical block diagram illustrating the flow of data in accordance with the method and apparatus of the present invention with examples of particular data structures.

FIG. 6 illustrates in more detail a preferred embodiment of the data flow associated with the method and apparatus of the present invention. While the blocks of FIG. 6 illustrate the principles associated with a preferred embodiment of the present invention, as one skilled in the art will readily appreciate, the principles may be implemented in various manners. A preferred manner of practicing these teachings is in conjunction with a digital computer, using data structures to store the data and software instructions to manipulate the data as required. Using a high level computer software language, the data manipulation steps of the present invention may be performed to generate the integrated circuit test patterns.

Block 250 of FIG. 6 represents the structure of a typical module pattern. The module pattern includes a plurality of time specific data blocks, each data block having a time stamp and a data group. As shown in block 250, a representative module pattern has a first data block extending from the first row to the third row. The first row includes a time stamp for the data block, the second row includes data, and the third row includes a partial line of data as well as a time stamp for a second data block. Data for the second data block begins and ends in the fourth line of the module pattern. Subsequent data blocks are contained in the module pattern until the module pattern is complete. As was previously discussed, each data block in the module pattern represents either signals that are to be asserted to the module at a point in time or output data to be read from the module at a point in time.

Method step 150 of FIG. 4 groups the module patterns 250, based upon the time stamps, into time packets as is shown in block 252 of FIG. 6. Each particular time stamp associates with it at least one row of data of block 252. Time stamp one of block 252 includes four rows of data, time stamp two includes two rows of data, and time stamp three includes only a single row of data. Such may be the case, for example, since at various points in time different events occur, some requiring not data, some requiring significant data. As compared to the data structure of the module patterns of block 250, the data structure of block 252 is neatly organized for further steps in time packets.

Method step 152 of FIG. 4 converts the time packets into clock phase packets based upon system clock information, the clock phase packets represented at block 254. Based upon a period of the system clock and the time stamp information, the clock phase packets are constructed. While the clock phase packets retains time stamp information, the phase of the system clock is related to the time packets. Converting from the time packets of block 252 to the clock phase packets of block 254 requires the integrated circuit data, illustrated at block 256 of FIG. 6, and previously described.

In accordance with a preferred form of the present invention, the integrated circuit data is used not only to define the system clock parameters but also to identify the signals that are generated via the internal bus and the signals that are generated via the external connections of the modules. For example, block 254 illustrates that phase A ($\emptyset_A$) of the system clock is associates with time stamp one and time stamp two. Time stamp one associates with data applied internally to a module via the internal bus within the integrated circuit while time stamp two associates with both externally applied data and internally applied data. Phase B ($\emptyset_B$) of the clock associates with time stamp three, time stamp four and time stamp five. Time stamps three and four associated with internally applied data while time stamp five associates with externally applied data. Thus, the clock phase packets, as organized in block 254, recognizes that certain data is to be applied to the modules of the integrated circuit via the test port via the internal bus while other data is to be applied to modules via external connections to the modules themselves.

The clock phase packets of block 254 also "no data" cycles of the module patterns. As shown, phase C ($\emptyset_C$) of the system clock, associated with time stamp six includes no data. As is known, operations performed by modules within the integrated circuit often require at least one clock cycle to perform. Thus, during phase C ($\emptyset_C$) of the system clock, no data is applied to, or read from, the module under test so that the module may complete an operation. In accordance with step 152 of FIG. 4, the method of the present invention uses the integrated circuit data 256 and the time stamps of block 252 to generate such "no data" cycles.

Based on the integrated circuit data of block 256 and the clock phase data of block 254, step 154 of the method of FIG. 4 converts the clock phase packets into slot packets. In accordance with a preferred embodiment of the present invention, a test port is used to access the internal bus of the integrated circuit. The slot packets correspond to accesses of the test port. As was previously described, the test port has timing limitations and data limitations that are described in the integrated circuit of data 256. These test port timing and data limitations directly affect how the clock phase packets may be applied to the module under test. Therefore, step 154 of FIG. 4 determines how the clock phase packets of block 254 of FIG. 6 may be applied via the test port and the external connections, if any.

Block 258 of FIG. 6 represents a combination of commands and data, called slot data, that are required to assemble internal bus cycles used to assert the data or read the data from the modules. In addition, block 258 represents the time shifting requirements associated with applying the slot data to the test port, and with applying the external data to the external connections of the modules.

Each access of a module via the test port has an associated time shift. Thus, accesses of the module via the test port must be manipulated such that data read from and written to the internal bus via the test port compensates for such time shifts and executes the internal bus cycles on the correct clock phase. In addition, the test port is preferably designed such that slot data is created only for changes in the data from the previous bus cycle. This slot data is used to construct the next internal bus cycle, and is latched into the test port via external test port connections.

For example, when data is to be read from a module via the internal bus, the address of the module must first be latched into the test port by way of external test port connections, then the test port applies the address to the internal bus, thus accessing the module and subsequently returning the data provided by the module onto the test port external connections. Alternatively, when writing data to a module, both the address of the module and the data to be written must first be latched into the test port via the test port external connections, then the test port applies the address and the data to the internal bus, resulting in a write to the module.

As is shown by the data contained in block 258, some clock phases and slots assert no data or read no data. Thus is the case because the test port must perform functions internally in order to manipulate data between the module and the test port. During these particular periods in time, an additional slot of "no data" is added corresponding to an operation of the test port. If there is no slot data during a specified clock phase, there may or may not be external pin activity during these clock phases. External pin activity occurs independently of the slot data, and is recorded and converted with respect to the correct clock phase.

As one skilled in the art will readily appreciate, the configuration of the test port itself will alter the accesses made through the test port to test the modules. If the test port may be accessed via 16 pins, fewer instructions will be required to perform an equivalent test as compared to the situation where only 8 pins may be used to access the test port. Thus, even if the integrated circuit included identical functional modules, if parameters relating to the test port change, the integrated circuit patterns will also change to perform identical testing of modules.

As is also illustrated via the data of block 258, more than one slot packet associates with each phase of the internal clock. As one skilled in the art will readily appreciate, in order to more quickly test the operation of the integrated circuit, the frequency of operation of the test port is preferably greater than the frequency of operation of the internal bus and modules. Thus, in a preferred mode of operation of the present invention, the frequency of operation of the test port is at least twice as great as the frequency of operation of the integrated circuit as a whole.

Since the integrated circuit data 256 includes the timing requirements of the test port, the time illustrated in block 258, designated as slot time one (ST1), slot time two (ST2), etc., is a new measure of time that has been generated based upon the test port timing requirements and the maximum clocking frequency of the internal bus. In addition, the external data is also a new measure of time, but still relating to it's respective clock phase. These points in time are subsequently used to generate test vectors that will be applied to an integrated circuit under test.

Based upon the slot data and the external data contained in block 258 of FIG. 6, the generation of the integrated circuit test patterns in conjunction with step 156 of FIG. 4 is accomplished by taking the information contained in block 258 and writing a sequence of data in a desired integrated circuit test pattern format. As one skilled in the art will readily appreciate, the data associated with each slot, clock phase, and time relates to signals that are to be asserted to the external connections of the integrated circuit. These signals include input/output line signals, the system clock of the integrated circuit, and other signals that must be asserted to operate the integrated circuit. Thus, data setup times, data assertion times, and other signal timing specifications are considered in generating the integrated circuit test patterns. The information relating to the timing requirements of the signals is contained in the integrated circuit test data of block 256.

Figure 7:
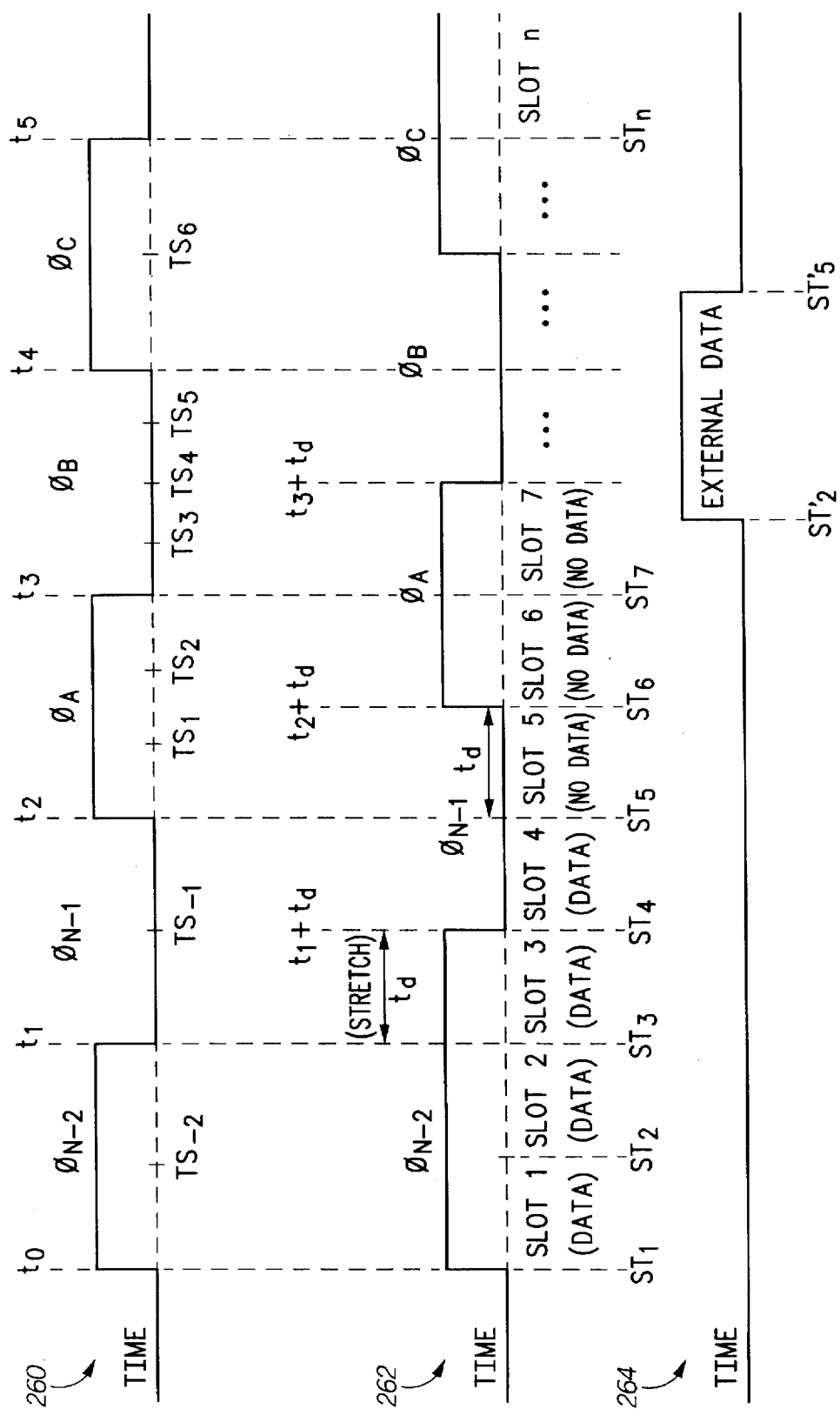
FIG. 7 is a signal transition diagram illustrating the clocking and data signals associated with the method and apparatus of the present invention.

FIG. 7 is a timing diagram showing representative signals applied to an integrated circuit in accordance with the slot packets of block 258 of FIG. 6. Signal 260 of FIG. 7 is a standard 50% duty cycle system clock that would be applied to the integrated circuit during normal operation of and integrated circuit. Time points t0, t1, t2, t3, t4 and t5 correspond to transitions of the system clock. Based upon the module patterns of block 250 and the associated time stamp data blocks of block 254 of FIG. 6, phase A (ØA) of the system clock corresponds to time stamp one (TS1) and time stamp two (TS2). Further, phase B (ØB) of the system clock corresponds to time stamp three (TS3), time stamp four (TS4), and time stamp five (TS5). Finally, phase C (ØC) of the system clock corresponds to time stamp six (TS6).

In accordance with the organization of data and the translation from clock phase packets to slot packets, portion 262 of FIG. 7 represents data as it is applied to the test port with each slot corresponding to one cycle of the test port. The time slots preferably align with the system clock applied to the integrated circuit. As is recalled, when an integrated circuit is tested, all signals, including the system clock are provided to the integrated circuit. Thus, the system clock is applied to the integrated circuit so that data provided and accessed through the test port will be correctly aligned with the system clock.

Still referring to portion 262 of FIG. 7, at time t0, the system clock transitions from a low to high, and the data of slot time one (ST1) is transferred via the external connections of the integrated circuit associated with the test port based upon the data assertion and timing constraints of the test port. During slot times two (ST2) and three (ST3), data is also transferred via the test port. However, as is shown, since slot time three (ST3) is required to generate the internal bus cycle for phase A (ØA) of the system clock due to its functionality, phase N-2 (ØN-2) of the system clock is extended, or stretched, so that the data may be latched into the test port prior to phase A (ØA) of the system clock. Because the test patterns applied to the integrated circuit determine the clocking requirements of the integrated circuit, the integrated circuit patterns vary the system clock as is required to perform the testing of the integrated circuit. Thus, as is illustrated in portion 262 of FIG. 7, phase N-2 (ØN-2) of the system clock has been extended so that it is three slots wide instead of the normal width of two slots. As one skilled in the art will appreciate, however, depending upon the operational characteristics of the integrated circuit, the width of the system clock could be narrowed to occupy only a single slot. As can be seen from portion 262 of FIG. 7, the system clock phase A (ØA) has been delayed in time, shown as td, by the amount of stretch required to load the slot data into the test port. This delay time accumulates throughout the pattern as more stretches are needed.

Still referring to portion 262 of FIG. 7, slot four corresponds to test port data simulating a first portion of phase B (ØB) of the system clock. During slot four, data is asserted at the test port during phase N-1 (ØN-1). However, slot five occupies the second half of phase N-1 (ØN-1) of the system clock during which no data is asserted or read. During slot six and slot seven, corresponding to phase A (ØA) of the system clock, no data is asserted or read at the external connections of the integrated circuit. Such is the case because the integrated circuit is performing functions internally either within a module or on the internal bus during phase C (ØC).

Portion 264 of FIG. 7 shows how the external transfer of data is coordinated with data that is transferred through the test port within the integrated circuit test patterns. With reference to blocks 254 and 258 of FIG. 6, some external data is transferred directly to the modules of the integrated circuit via external connections during phase A (ØA) at time stamp two (TS2) and phase B (ØB) of the system clock at time stamp five (TS5). The signals correspond to an assertion of an external signal and the release of the same external signal. The translation process of this invention retains the placement of the external data within its corresponding clock phase, but adjusts the time to the new measure of time by adding the current time delay (td) to the original time. Referring to FIG. 6, the external data in portion 254 relating to time stamp two (TS2) is converted to a new time, time stamp two prime (TS2'), shown in portion 258 of FIG. 6, which includes the adjustment of time as shown in portion 264 of FIG. 7. This is also true for time stamp five (TS5). This particular external signal could correspond to a particular communication line associated with communication port 26 of FIG. 1. The integrated circuit test pattern therefore contains the connection, timing, and signal level information that are used by the tester to assert signals at particular points in time. Based upon this information, the test vectors generated from the integrated circuit test pattern assert the signals of FIG. 7 during the testing of the integrated circuit.

Figure 8:
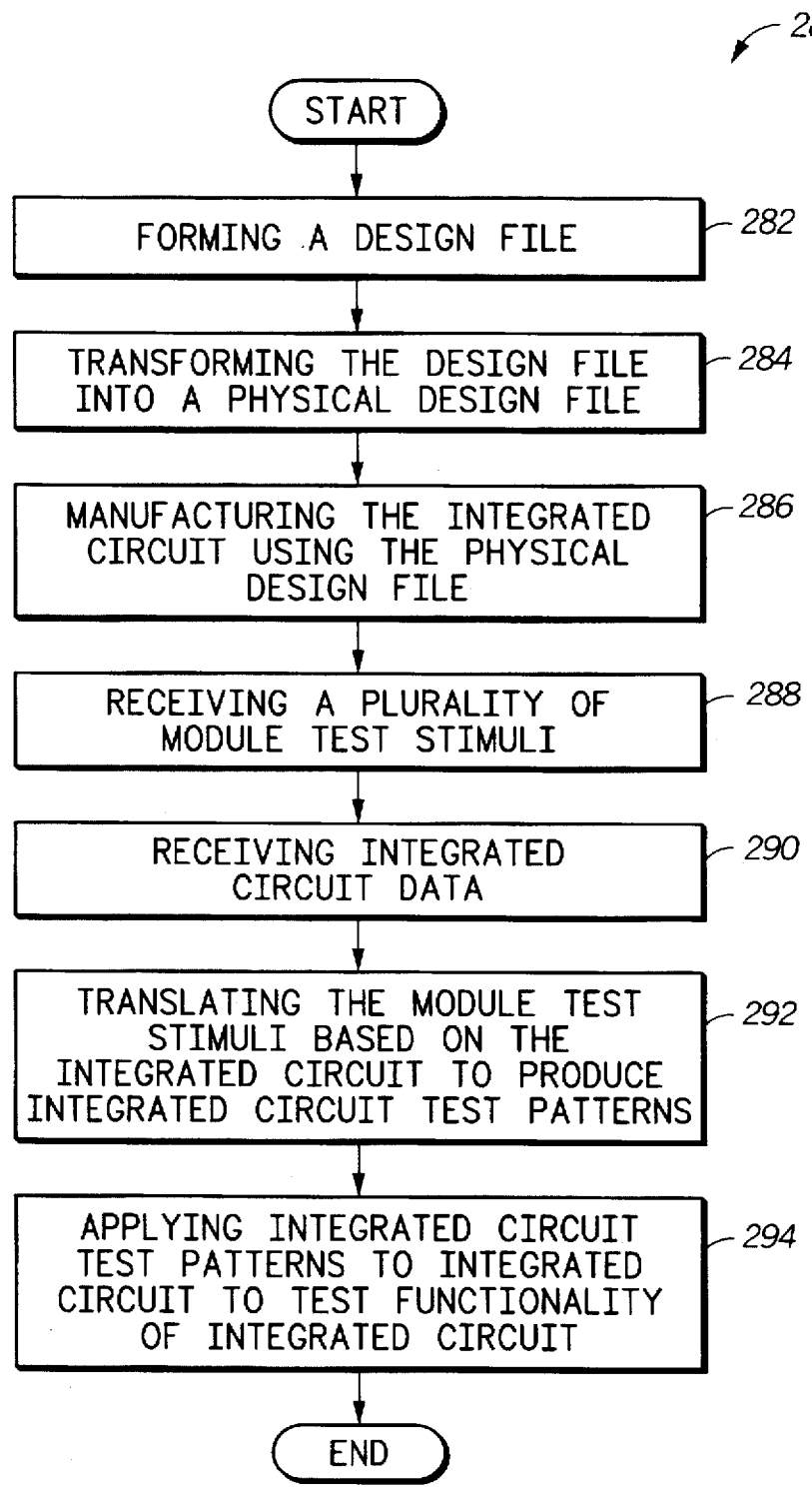
FIG. 8 is a logic diagram illustrating a method of manufacturing and testing an integrated circuit in accordance with the present invention.

FIG. 8 illustrates a method of manufacturing and testing an integrated circuit 280 in conjunction with the present invention. The method includes as a first step 282 forming a physical design file which contains a logical representation of an integrated circuit. The design file includes a logical representation of a plurality of modules, a plurality of buses, and a plurality of interconnections. Next, at step 284, the method includes transforming the design file into a physical design file. A physical design file locates the plurality of modules, the plurality of buses and the plurality of interconnections onto a two-dimensional substrate area of an integrated circuit die.

Next, at step 286 the method includes manufacturing an integrated circuit die onto at least one substrate in accordance with the physical design file. Next, at step 288, the method includes receiving a plurality of module test stimuli. Each of the module test stimuli is used to test a functionality of a respective module of the plurality of modules of the integrated circuit via connections of the respective module. As has been previously described, the module test stimuli are written in a high level language which may be compiled and applied to fully test the functionality of the modules.

Next, at step 290, the method includes receiving integrated circuit data. The integrated circuit data defines a relationship between external connections of the integrated circuit and connections of the plurality of modules. Further, the integrated circuit data preferably includes the timing information of the integrated circuit as well as the timing information of a test port that is included in the integrated circuit.

Next, at step 292, the method includes translating the plurality of module test stimuli to a plurality of integrated circuit test patterns based upon the integrated circuit data. The plurality of integrated circuit test patterns are applied to the external connections of the integrated circuit to test the functionality of the plurality of modules in the integrated circuit. These external connections will connect both to the test port and to the modules themselves according to the particular structure of the integrated circuit.

Next, at step 294, the method includes testing the functionality of the integrated circuit by applying a first portion of the integrated circuit test patterns to the external connection of the integrated circuit. The step further includes verifying the results received at the external connections against a second portion of the integrated circuit test patterns. As has been previously defined, the first portion the integrated circuit test pattern refers to the drive patterns of the integrated circuit test patterns and the second portion of the integrated circuit test patterns corresponds to the expected results of the integrated circuit test patterns.

In conjunction with method 280 of FIG. 8, integrated circuits may be manufactured and tested in a manner that reduces overall manufacturing costs. The manufacturing costs are reduced by reducing the expenses associated with developing integrated circuit test patterns, reducing the cycle time associated with the generation of integrated circuits, reducing the time required to generate test vector for testing the integrated circuits, increasing the accuracy of test vectors used to test the integrated circuit, and finally increasing the accuracy and functionality of the integrated circuits.

Preferably, the apparatus of the present invention also includes a computer readable medium that includes instructions in accordance with the present invention. Preferably, the instructions include receiving a plurality of module test stimuli, receiving integrated circuit data, translating the plurality of module test stimuli to a plurality of integrated circuit test patterns. Preferably, the computer readable medium comprises a diskette, or another form of storage device that may store a copy of the instructions that may be used in conjunction with a computer. The computer readable medium is not further described in that the requisite steps stored on the computer of a computer readable medium have been fully described previously in conjunction with the method of the present invention.

Figure 9:
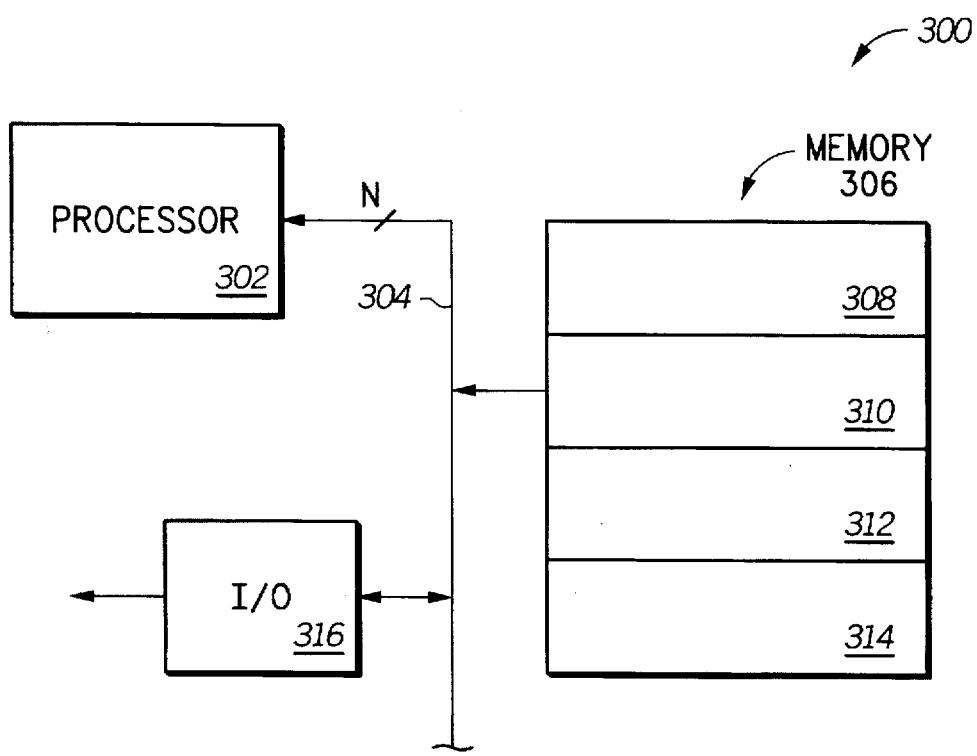
FIG. 9 is a block diagram illustrating a data processing system in accordance with the present invention.

FIG. 9 illustrates a data processing system 300 in conjunction with the present invention. Preferably, the data processing system 300 includes a processor 302, a processor bus that operably couples to the processor, and a memory 306 that operably couples to the processor bus 302. Preferably, the processor bus 304 is known in the art and includes data, instruction, and control portions. Further, the data processing system 300 preferably comprises an input/output port 316 that allows the data processing system 300 to communicate with external devices.

The memory 306 preferably includes a plurality of portions. A first portion 308 stores data for receiving a plurality of module test stimuli. Each of the module test stimuli is used to test the functionality of a plurality of modules of an integrated circuit via connections to the respective module. Memory portion 310 stores data for receiving integrated circuit data. The integrated circuit data defines the relationship between external connections to the integrated circuit in connection to the plurality of modules. Memory portion 312 stores data for translating the plurality of module test stimuli to a plurality of integrated circuit patterns based upon the integrated circuit data. The plurality of integrated circuit test patterns are applied to the external connections of the integrated circuit to test the functionality of the plurality of modules of the integrated circuit. Preferably, memory also includes section 314 which stores additional instructions for operating the data processing system 300 to accomplish the objectives of the data processing system.

Thus, the data processing system 300 of the present invention operates to implement the teachings of the present invention. As one skilled in the art will readily appreciate, the data processing system 300 of the present invention may be used to reduce the cost of manufacturing integrated circuits due to a reduction in testing time by reducing the costs associated with generating integrated circuit test patterns for testing integrated circuits.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. A method for generating integrated circuit test patterns, the method comprising the steps of:
   (a) providing a plurality of independent integrated circuit modules, each independent integrated circuit module in the plurality of integrated circuit modules containing logic gates to perform a specified function wherein each integrated circuit module communicates to an internal bus which is common to all integrated circuit modules;
   (b) providing a test source code segment for each independent integrated circuit module, each test source code segment respectively testing one of the independent integrated circuit modules using the internal bus and dedicated external terminals associated with the respective independent integrated circuit module;
   (c) simulating each independent integrated circuit module in the plurality of independent integrated circuit modules using the test source code segments to derive simulation signal activity, the simulation signal activity being the stimulus needed on the internal bus and on the dedicated external terminals in order to test each integrated circuit module in the plurality of independent integrated circuit modules;
   (d) integrating the plurality of independent integrated circuit modules onto a single integrated circuit where all of the independent integrated circuit modules are coupled to the internal bus, the internal bus being coupled to an internal test port module which is located on the single integrated circuit;
   (e) providing integrated circuit data which: (1) indicates a manner in which the plurality of independent integrated circuit modules are integrated onto the single integrated circuit; and (2) indicates an external terminal configuration of the internal test port module; and
   (f) providing the integrated circuit data and simulation signal activity to a software program to generate integrated circuit test patterns, the integrated circuit test patterns being patterns which, when applied to external terminals of the internal test port module of the single integrated circuit, reproduce the simulation signal activity on the internal bus in order to test the independent integrated circuit modules of the single integrated circuit.

2. The method of claim 1 wherein the step (c) further comprises:
   simulating each integrated circuit module using the test source code segments to derive simulation signal activity which includes expected output, the expected output being the signals needed on the internal bus and on the dedicated external terminals in order to verify correct response to the simulation signal activity of step (c).

3. The method of claim 1, wherein the integrated circuit data from step (e) further comprises: (3) timing data that is used in step (f) to translate timing constraints of the plurality of independent integrated circuit modules to timing constraints of external terminals of the single integrated circuit.

4. The method of claim 3, wherein the integrated circuit data further comprises test port timing data including:
(1) slot width data; (2) test clock setup data; and (3) test clock width data.

5. The method of claim 1 wherein the step (c) further comprises:
using strobe data provided from step (b) when simulating in step (c), the strobe data determining when test data is to be compared for test purposes.

6. The method of claim 1, wherein software program of step (f) translates simulation signal activity to a plurality of integrated circuit test patterns such that the integrated circuit test patterns include data written to test port data terminals, a test port.

7. The method of claim 1 wherein the step (c) further comprises:
providing a bus cycle generator, wherein the bus cycle generator uses the test source code segment and generates simulation signal activity based upon the test source code segment.

8. The method of claim 1, further comprising the step of:
(g) verifying the integrated circuit test patterns by applying integrated circuit drive patterns of the integrated circuit test patterns to a simulation tool programmed to simulate an operation of the single integrated circuit and comparing output results from the simulation tool to integrated circuit expected patterns of the integrated circuit test patterns.

9. A method for generating integrated circuit test patterns, the method comprising the steps of:
(a) providing a plurality of independent integrated circuit modules, each independent integrated circuit module in the plurality of integrated circuit modules containing logic gates to perform a specified function wherein each integrated circuit module communicates to an internal bus which is common to all integrated circuit modules;
(b) providing a test source code segment for each independent integrated circuit module, each test source code segment respectively testing one of the independent integrated circuit modules using the internal bus and dedicated external terminals associated with the respective independent integrated circuit module;
(c) simulating each independent integrated circuit module in the plurality of independent integrated circuit modules using the test source code segments to derive simulation signal activity, the simulation signal activity being the stimulus needed on the internal bus and on the dedicated external terminals in order to test each integrated circuit module in the plurality of independent integrated circuit modules;
(d) integrating the plurality of independent integrated circuit modules onto a single integrated circuit where all of the independent integrated circuit modules are coupled to the internal bus, the internal bus being coupled to an internal test port module which is located on the single integrated circuit;
(e) providing integrated circuit data which: (1) indicates a manner in which the plurality of independent integrated circuit modules are integrated onto the single integrated circuit; and (2) indicates an external terminal configuration of the internal test port module;
(f) grouping signal transitions of the simulation signal activity into time packets based upon respective time stamps of the simulation signal activity;
(g) converting the time packets into clock phase packets, wherein each clock phase packet corresponds to one phase of a particular clock cycle of an internal clock of the integrated circuit, and wherein each clock phase packet contains all time packets corresponding to a phase of the particular clock cycle;
(h) converting the clock phase packets into slot packets, wherein each slot packet corresponds to one access of the internal test port module; and
(i) generating the integrated circuit test patterns based upon the slot packets and the integrated circuit data, the integrated circuit test patterns are patterns which, when applied to external terminals of the internal test port module of the single integrated circuit, reproduce the simulation signal activity on the internal bus in order to test the independent integrated circuit modules of the single integrated circuit.

10. The method of claim 9 wherein the step (h) further comprises:
preventing the generation of a slot packet when the slot packet does not alter data from a previous bus cycle.

11. The method of claim 9 wherein step (i) further comprises:
extending a phase of the internal clock of the single integrated circuit for at least one slot width when a specific clock phase packet generates more slot packets than a number of slot packets that normally fit into the phase of the internal clock of the single integrated circuit.

12. The method of claim 9 wherein step (i) further comprises:
determining proper slot time alignment for a bus read cycle, and placing the slot packet associated with the bus read cycle at a subsequent time in a slot packet sequence to properly access data read from a module across the internal bus.

13. A method for generating integrated circuit test patterns, comprising the steps of:
(a) providing a plurality of independent integrated circuit modules, each integrated circuit module containing logic gates to perform a specified function wherein each integrated circuit module communicates to an internal bus which is common to all integrated circuit modules;
(b) providing a test source code segment for each integrated circuit module, each test source code segment respectively testing one of the independent integrated circuit modules using the internal bus and dedicated external terminals associated with the respective independent integrated circuit module;
(c) simulating each integrated circuit module using the test source code segments to derive simulation signal activity, the simulation signal activity being the stimulus needed on the internal bus and on the dedicated external terminals in order to test each integrated circuit module;
(d) integrating the plurality of independent integrated circuit modules onto a single integrated circuit where all of the independent integrated circuit modules are coupled to the internal bus, the internal bus being coupled to an internal test port module which is located on the single integrated circuit;

(e) providing integrated circuit data which: (1) indicates a manner in which the plurality of independent integrated circuit modules are integrated onto the single integrated circuit; and (2) indicates an external terminal configuration of the internal test port module;

(f) grouping signal transitions of the simulation signal activity into time packets based upon respective time stamps of the simulation signal activity;

(g) converting the time packets into clock phase packets, wherein each clock phase packet corresponds to one phase of a particular clock cycle of an internal clock of the integrated circuit, and wherein each clock phase packet contains all time packets corresponding to a phase of the particular clock cycle;

(h) converting the clock phase packets into slot packets, wherein each slot packet corresponds to one access of the internal test port module wherein generation of a slot packet is prevented when the slot packet does not alter data from a previous bus cycle; and (i) generating the integrated circuit test patterns based upon the slot packets and the integrated circuit data, extending a phase of the internal clock of the single integrated circuit for at least one slot width when needed, and determining proper slot time alignment for a bus read cycle, and placing the bus read cycle at a subsequent time to properly access data read from a module across the internal bus, the integrated circuit test patterns are patterns which, when applied to external terminals of the internal test port module of the single integrated circuit, reproduce the simulation signal activity on the internal bus in order to test the independent integrated circuit modules of the single integrated circuit.

* * * * *